US 8,741,535 B2

United States Patent
Lee et al.

(10) Patent No.: US 8,741,535 B2
(45) Date of Patent: Jun. 3, 2014

(54) LASER IRRADIATION DEVICE AND METHOD OF FABRICATING ORGANIC LIGHT EMITTING DISPLAY DEVICE USING THE SAME

(71) Applicants: Jae-Ho Lee, Yongin (KR); Seong-Taek Lee, Yongin (KR); Mu-Hyun Kim, Yongin (KR); Nam-Choul Yang, Yongin (KR); Noh-Min Kwak, Yongin (KR); Young-Gil Kwon, Yongin (KR); Tae-Min Kang, Yongin (KR); Sok-Won Noh, Yongin (KR); Myung-Won Song, Yongin (KR); Sam-Il Kho, Yongin (KR)

(72) Inventors: Jae-Ho Lee, Yongin (KR); Seong-Taek Lee, Yongin (KR); Mu-Hyun Kim, Yongin (KR); Nam-Choul Yang, Yongin (KR); Noh-Min Kwak, Yongin (KR); Young-Gil Kwon, Yongin (KR); Tae-Min Kang, Yongin (KR); Sok-Won Noh, Yongin (KR); Myung-Won Song, Yongin (KR); Sam-Il Kho, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/920,936

(22) Filed: Jun. 18, 2013

(65) Prior Publication Data
US 2013/0285290 A1 Oct. 31, 2013

Related U.S. Application Data

(62) Division of application No. 11/654,276, filed on Jan. 16, 2007, now Pat. No. 8,486,586.

(30) Foreign Application Priority Data

Jan. 16, 2006 (KR) .................. 10-2006-0004569

(51) Int. Cl.
G03C 8/00 (2006.01)
G03F 1/00 (2012.01)

(52) U.S. Cl.
USPC .............................. 430/199; 430/5

(58) Field of Classification Search
USPC ........................................ 430/199, 5
See application file for complete search history.

(56) References Cited

U.S. PATENT DOCUMENTS

2006/0003235 A1 1/2006 Sugimoto
2006/0051682 A1 3/2006 Hess et al.
(Continued)

FOREIGN PATENT DOCUMENTS

JP 09-174271 7/1997
JP 2002-144069 5/2002
(Continued)

OTHER PUBLICATIONS

English translation of JP Publication 2005-249937, Sep. 2005.*

(Continued)

*Primary Examiner* — Brittany Raymond
(74) *Attorney, Agent, or Firm* — Knobbe, Martens, Olson & Bear, LLP

(57) ABSTRACT

A laser irradiation device and a method of fabricating an organic light emitting display device (OLED) using the same are disclosed. The laser irradiation device includes: a laser source generating a laser beam; a mask disposed below the laser source and patterning the beam and a projection lens disposed below the mask and determining magnification of the laser beam through the mask, wherein the laser beam penetrating the mask has different doses in at least two regions. Thus, the laser irradiation device can maximize emission efficiency and enhance the quality of a transfer layer pattern when an organic layer of the OLED is formed using the laser irradiation device.

9 Claims, 7 Drawing Sheets

(56) References Cited

U.S. PATENT DOCUMENTS

2006/0105249 A1 5/2006 Kushida et al.
2007/0077349 A1* 4/2007 Newman et al. .............. 427/66
2007/0128526 A1 6/2007 Wallace et al.

FOREIGN PATENT DOCUMENTS

| JP | 2005-152966 | | 6/2005 |
|---|---|---|---|
| JP | 2005-249937 | * | 9/2005 |
| KP | 10-2006-0000745 A | | 1/2006 |
| KR | 10-2005-0063534 A | | 6/2005 |
| KR | 10-2006-0026788 | | 3/2006 |
| KR | 10-2006-0027750 | | 3/2006 |
| KR | 10-2006-0062553 | | 6/2006 |

OTHER PUBLICATIONS

English translation of JP Publication 2005-249937 to Morizumi et al., Sep. 2005.

Korean Office Action issued Dec. 12, 2006 in Korean Patent Application No. 10-2006-0004569.

Notice of Allowance issued Aug. 2, 2007 in counterpart Korean patent application No. 10-20060004569 in 2 pages.

* cited by examiner

LASER IRRADIATION DEVICE AND METHOD OF FABRICATING ORGANIC LIGHT EMITTING DISPLAY DEVICE USING THE SAME

CROSS-REFERENCE TO RELATED APPLICATIONS

This application is a divisional application which claims priority under 35 U.S.C. §120 from U.S. patent application Ser. No. 11/654,276, filed on Jan. 16, 2007 which claims priority to and the benefit of Korean Patent Application No. 10-2006-0004569, filed on Jan. 16, 2006, the disclosure of each of which is incorporated by reference in its entirety.

BACKGROUND

1. Field

The present disclosure relates to a laser irradiation device and a method of fabricating an organic light emitting display device (OLED) using the same, and more particularly, to a laser irradiation device which can enhance the quality of a transfer layer pattern and maximize transfer efficiency when an organic layer is formed by a laser induced thermal imaging (LITI) method, and a method of fabricating an OLED using the same.

2. Description of the Related Technology

Among flat panel displays, OLEDs can display high-quality moving pictures regardless of device size. OLEDs also have a fast response speed, low power consumption, and a wide viewing angle. In addition, OLEDs are self emissive, and thus need no additional light source. OLEDs also have drawn attention as a next generation flat panel display because they can be manufactured at a low temperature and by a simple process using conventional semiconductor processes.

In fabricating an OLED, various methods can be used to pattern an organic layer including an organic emission layer. Among other methods, a Laser-Induced Thermal Imaging (LITI) method can yield excellent pattern uniformity. The LITI method is favorable for large-size OLEDs.

SUMMARY

The instant disclosure provides a laser irradiation device which can maximize transfer efficiency in the fabrication of an organic layer by a laser induced thermal imaging (LITI) method, and enhance the quality of a transfer layer pattern, and a method of fabricating an organic light emitting display device (OLED) using the laser irradiation device.

One aspect of the invention provides a laser irradiation device for laser-induced thermal imaging. The device comprises: a laser source configured to generate a laser beam; and a mask configured to selectively pass the laser beam therethrough toward a projection plane, the mask comprising a light transmitting portion, wherein the light transmitting portion has a first length measured in a first axis and a second length measured in a second axis substantially perpendicular to the first axis, wherein the first length varies along the second axis, wherein the first length is greater at both ends of the light transmitting portion along the second axis than the center between the both ends, wherein the mask is configured to move relative to the projection plane along the first axis.

The first length may change substantially stepwise at least two times along the second axis. The first length may change substantially smoothly along at least part of the second axis. The first length may change substantially linearly along at least part of the second axis. The second length may not vary along the first axis. The second length may vary along the first axis. The first length may be the largest at one of the both ends along the second axis. The first length may be the shortest in the central area of the light transmitting portion along the second axis. The light transmitting portion may comprise an area where the first length does not vary along the second axis. The light transmitting portion may surround a light blocking portion. The mask may further comprise a plurality of light transmitting portions.

Another aspect of the invention provides a method of making a display device. The method comprises: providing a partially fabricated display device; providing the laser irradiation device described above; placing a donor device between the partially fabricated display device and the laser irradiation device, the donor device comprising a transferable layer, wherein the transferable layer faces the partially fabricated display device; and irradiating a laser beam through the mask onto a surface of the donor device, the surface facing the laser beam, while moving the laser beam relative to the donor device along the first axis.

The display device may comprise a partially fabricated organic light emitting display device. The laser beam may reach part of the donor device surface and move along the first axis, and a portion of the transferable layer opposing the part of the donor device surface may be released from the donor device. The laser beam may contact part of the donor device surface and move along the first axis, wherein a portion of the transferable layer opposing the part of the donor device surface receives energy from the laser beam, and wherein the amount of energy varies in the portion along the second axis. The amount of energy may be greater near two opposing edges of the portion that are generally parallel to the first axis than in the middle of the portion between the two opposing edges.

The display device may have a surface facing the transferable layer, wherein the display device comprises a recess on the surface, the recess having two opposing edges that are generally parallel to the first axis, and wherein the two opposing edges of the portion of the transferable layer substantially face the two opposing edges of the recess. The middle of the portion of the transferable layer may have a shape generally corresponding to the shape of the recess when viewed from over the surface of the display device. Two opposing edges of the portion that are generally parallel to the first axis may receive the energy for a longer period of time than the middle of the portion between the two opposing edges. The energy may comprise thermal energy.

In one embodiment, a laser irradiation device includes: a laser source generating a laser beam; a mask disposed below the laser source, and patterning the laser beam; and a projection lens disposed below the mask and determining magnification of the laser beam penetrating the mask, wherein the laser beam penetrating the mask has different doses in at least two regions.

In another embodiment, a method of fabricating an OLED includes: preparing a substrate including a pixel defining layer having a pixel electrode and an opening exposing the pixel electrode; laminating a donor substrate including a base layer, a light-to-heat conversion layer, and a transfer layer on the substrate; disposing a laser irradiation device including a laser source generating a laser beam, a mask disposed below the laser source, and a projection lens disposed below the mask on the donor substrate, the laser beam transmitting the mask having different doses in at least two regions; and irradiating the donor substrate with the laser beam using the laser irradiation device to transfer at least a part of the transfer layer to the substrate so as to form an organic layer in the opening.

BRIEF DESCRIPTION OF THE DRAWINGS

The instant disclosure will be described with reference to certain embodiments shown in the attached drawings, wherein.

DETAILED DESCRIPTION

The instant disclosure will become more apparent from the following detailed description of embodiments and the accompanying drawings.

In general, a LITI method uses laser to transfer an organic layer from a donor substrate onto a partially fabricated device. The donor substrate may include a base layer, a light-to-heat conversion layer and a transferable layer. The transfer layer is transferred from the donor substrate to the device by the LITI method.

In the LITI method, the transfer layer is positioned to face an acceptor substrate (or a partially fabricated device). Then, a laser beam is irradiated onto the base layer. The laser beam irradiated onto the base layer is absorbed in the light-to-heat conversion layer. The light energy is converted into thermal energy. The thermal energy is used to transfer the transfer layer onto the acceptor substrate, thereby forming a transfer layer pattern on the acceptor substrate.

Figure 1A:
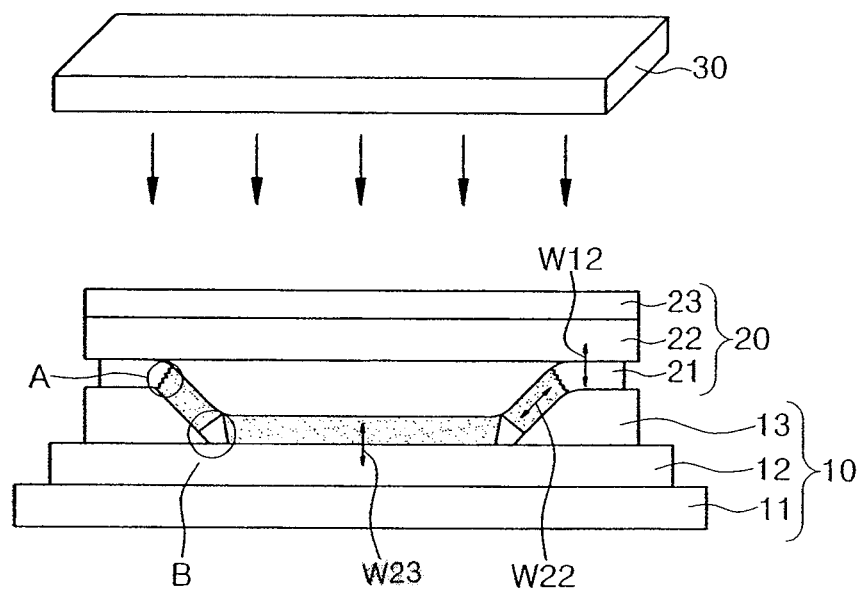
FIG. 1A is a cross-sectional view illustrating a process of fabricating an organic layer of an OLED using a laser irradiation device.
Figure 1B:
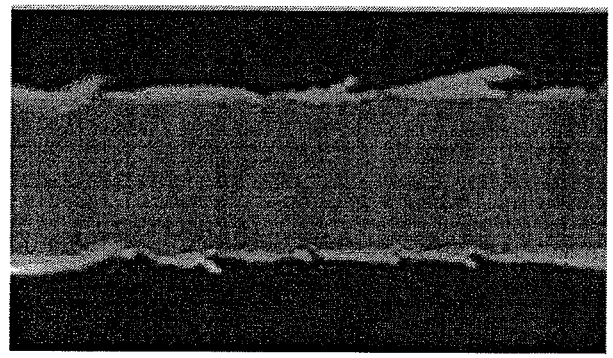
FIG. 1B is a photograph showing the quality of a transfer layer pattern of an organic layer formed by the process of FIG. 1A.
Figure 1C:
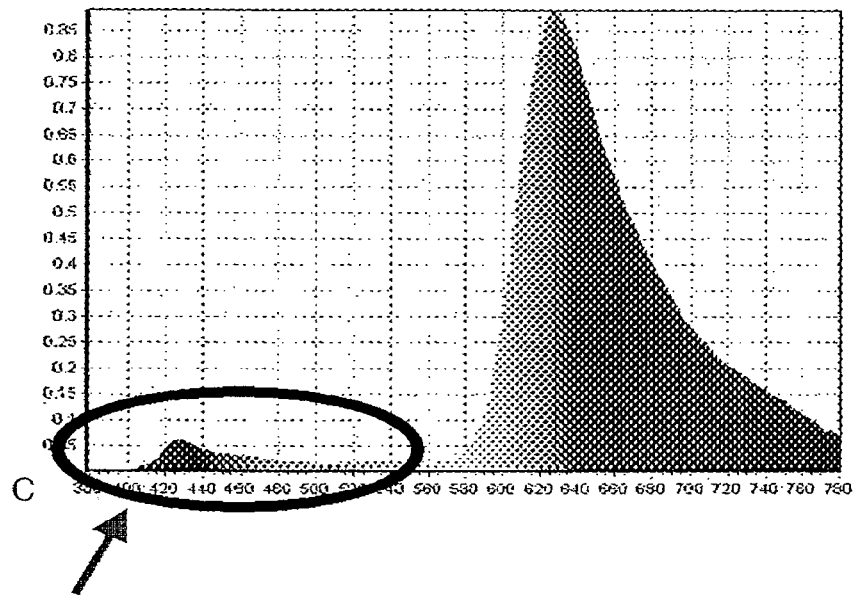
FIG. 1C is a graph showing the light emission intensities of the organic layer of FIG. 1B.

FIG. 1A is a cross-sectional view illustrating a process of fabricating an organic layer of an OLED using a laser irradiation device. FIG. 1B is a photograph showing the quality of a transfer layer pattern of the organic layer. FIG. 1C is an emission graph of the organic layer.

Referring to FIG. 1A, first, a partially fabricated organic light emitting display device (OLED) 10 is provided. The OLED 10 includes a substrate 11 formed of glass or plastic, a first electrode 12 formed over the substrate 11, and a pixel defining layer 13 having an opening exposing a portion of the first electrode 12. Although not shown, the substrate 11 may include various other electronic components such as thin film transistors, and wirings. Then, a donor substrate 20 having a transfer layer 21, a light-to-heat conversion layer 22, and a base layer 23 is positioned to face and at least partially contact the OLED 10.

A predetermined portion of the donor substrate 20 is irradiated with a laser beam, using a laser irradiation device 30. The device 30 may include a laser source, a mask, and a projection lens. When the laser beam is applied onto the donor substrate 20, the transfer layer 21 attached to the donor substrate 20 is separated from the donor substrate 20, and is transferred onto the OLED 10. Here, transfer characteristics are determined by a first adhesion W12 between the OLED 10 and the transfer layer 21, a cohesion W22 of the transfer layer 21, and a second adhesion W23 between the transfer layer 21 and the OLED 10. In one embodiment, the layers are formed such that the cohesion W22 of the transfer layer is less than the first and second adhesion W12 and W23.

An irradiated portion of the transfer layer 21 is separated from the donor substrate 20, and is transferred to the OLED 10 while a non-irradiated portion of the transfer layer 21 may remain on the donor substrate 20. The transferred layer forms a transfer layer pattern on the OLED 10. Thus, the transfer layer pattern forms an organic layer of an OLED.

In the illustrated laser irradiation device 30, when light generated from the laser source passes through the mask, it is shaped by the mask. The light reaches the projection lens which magnifies the light such that a uniform dose of the laser beam per unit area is irradiated onto substantially the entire region of the donor substrate.

More energy than that for transferring the donor substrate to the substrate is required to cut the irradiated portion of the transfer layer from the non-irradiated portion of the transfer layer. Accordingly, when substantially the entire region of donor substrate 20 is irradiated with the dose of the laser beam for transferring the donor substrate 20 onto the substrate, as illustrated at reference mark A, the irradiated portion may not be properly cut from the non-irradiated portion of the transfer layer 21. Therefore, as illustrated in FIG. 1B, a non-uniform transfer layer pattern may be obtained.

Also, as denoted by reference mark B of FIG. 1A, the donor substrate may not adhere closely to an edge portion of the opening due to the topology of the OLED 10. This may cause a defect in the organic light emitting layer. In the context of this document, such a defect may be referred to as an "edge open defect." Such an edge open defect of an organic layer may cause undesired emission, as illustrated by reference mark C in FIG. 1C, thereby deteriorating color coordinates and emission efficiency.

On the other hand, when a higher dose of the laser beam than required is radiated onto substantially the entire region of the donor substrate 20 to transfer the donor substrate 20, excessive heat may be applied to the transfer layer 21. The excessive heat may affect brightness, emission efficiency and lifespan of the OLED.

Figure 2:
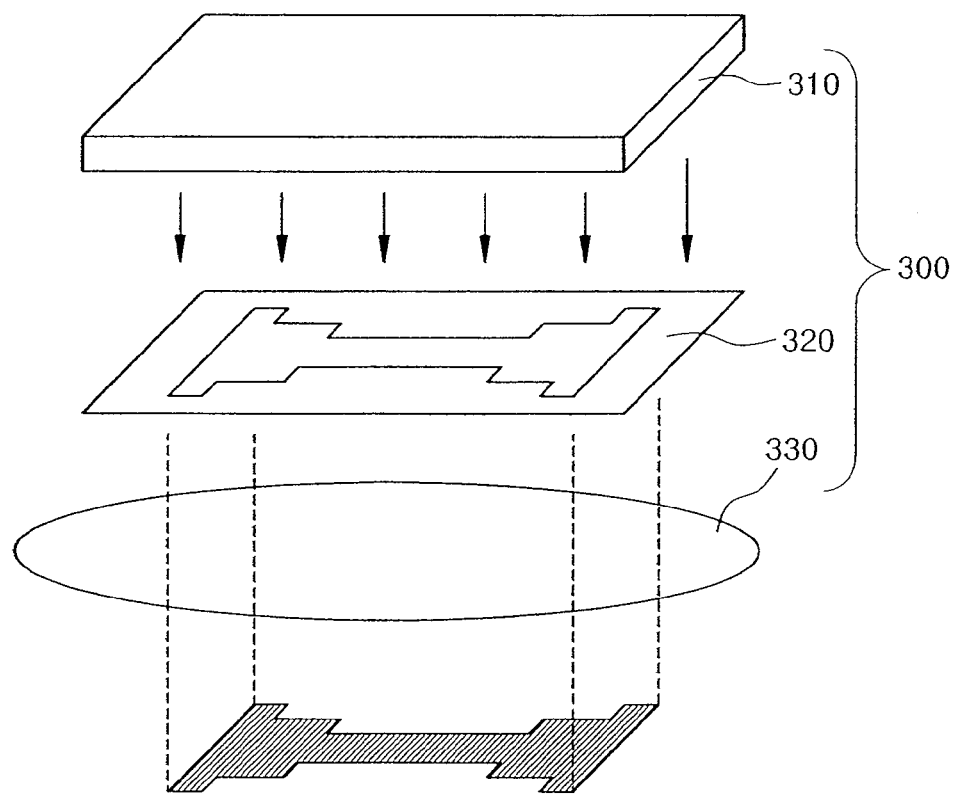
FIG. 2 is a schematic perspective view illustrating a laser irradiation device according to one embodiment.

FIG. 2 illustrates a laser irradiation device according to one embodiment. Referring to FIG. 2, a laser irradiation device 300 used for a laser induced thermal imaging (LITI) method may include a laser source 310 generating a laser beam, a mask 320 disposed below the laser source for patterning the laser beam, and a projection lens 330 disposed below the mask for determining magnification of the laser beam patterned through the mask.

The laser source 310 is a device for generating a laser beam. The beam generated from the laser source 310 penetrates a beam-shaped transformation device (not illustrated). The beam-shaped transformation device may transform a beam having a Gaussian profile generated from the laser source into a beam having a uniform flat-top profile. The laser beam generated from the laser source 310 passes through the mask 320. The mask 320 will be described in detail below.

Figure 3A:
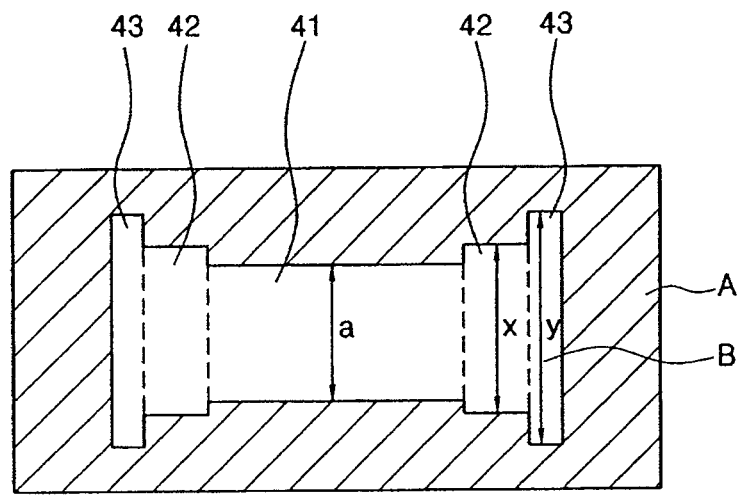
FIGS. 3A to 3G are top plan views of embodiments of masks of a laser irradiation device.

FIGS. 3A to 3G are top plan views of masks for a laser irradiation device according to embodiments. Referring to FIG. 3A, the mask includes a light blocking part A which blocks laser and a light transmitting part B which transmits laser. The light transmitting part B may be formed of a transparent material. In other embodiments, the light transmitting part B may be an opening.

In the illustrated embodiment, the light transmitting part B may include a first region 41, second regions 42, and third regions 43. In FIG. 3A, the regions 41, 42, 43 are adjacent to one another in a substantially horizontal direction. The second regions 42 are on both sides of the first region 41. The first region 41 is interposed between the two second regions 42. The third regions 43 neighbor the second region 42 on opposite side from the first region 41. During the LITI process, the second region 42 may be positioned to overlap with an edge portion of an opening of an OLED where an organic layer and a pixel defining layer meet with each other.

The regions 41, 42, 43 have widths extending substantially perpendicular to a direction in which the regions are arranged. In FIG. 3A, the width of the first region 41 is denoted by "a." The width x of the second region 42 may be about 1.05 to about 1.1 times the width a of the first region 41. The width y of the third region 43 may be about 1.1 to about 1.5 times the width a of the first region 41.

The regions 41, 42, 43 may also have a length extending substantially parallel to a direction in which the regions are aligned. In FIG. 3A, the lengths of the second and third regions 42 and 43 on both sides of the first region 41 may be substantially the same, thereby forming a symmetrical shape. The regions 41, 42, 43 of the light transmitting part B form steps on upper and lower parts of the light transmitting part B.

Figure 3B:
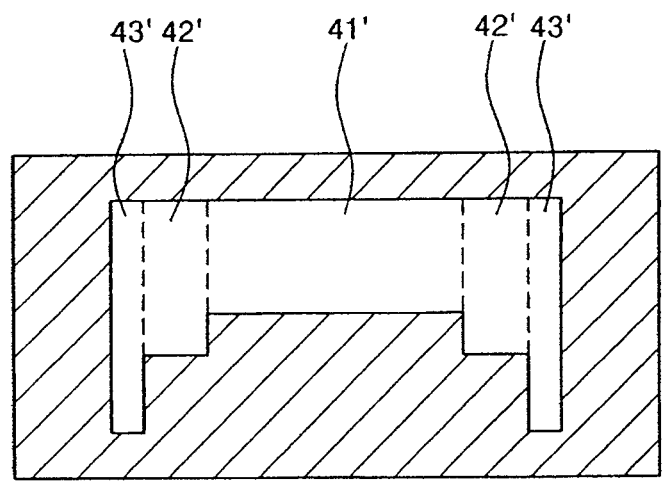
Figure 3C:
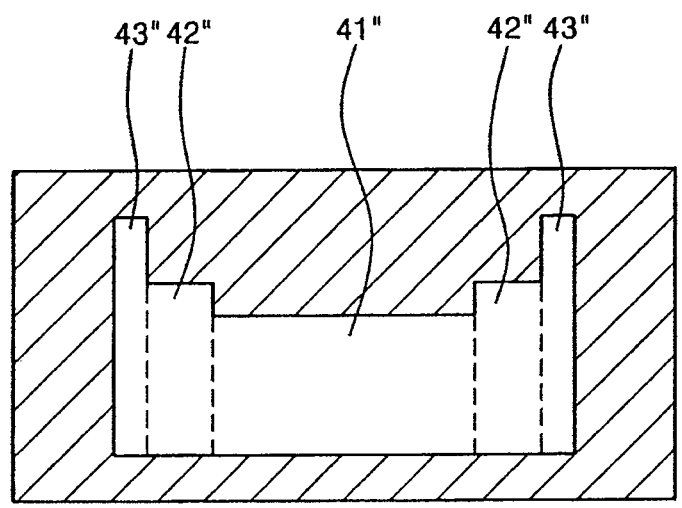

In other embodiments, referring to FIGS. 3B and 3C, the second and third regions 42', 42", 43' and 43" in the light transmitting part B may form steps on either the upper or lower part of the light transmitting part B.

Figure 3D:
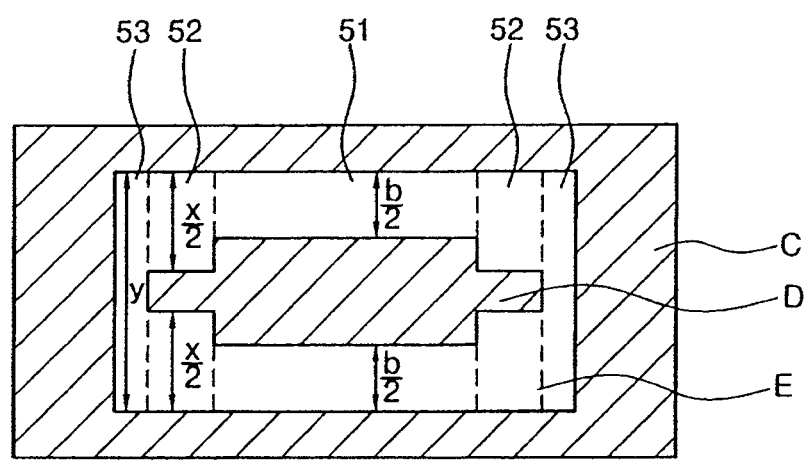

Referring to FIG. 3D, a mask may include first and second light blocking parts C and D for blocking a laser beam, and a light transmitting part E transmitting the laser beam. The light transmitting part E is positioned between the first and second light blocking parts C and D. The light transmitting part E may include a first region 51, second regions 52, and third regions 53. The second regions 52 are positioned on both sides of the first region 51. The third regions 53 neighbor the second regions 52 on the opposite side from the first region 51. During a LITI process, the second regions 52 may be positioned over an edge part of an organic layer. The third region 53 may be positioned over an edge of the organic layer.

In the illustrated embodiment, the widths x of the second regions 52 may be about 1.05 to about 1.1 times the width b of the first region 51. The widths y of the third regions 53 may be about 1.1 to about 1.5 times the width b of the first region 51.

The horizontal lengths of the second and third regions 52 and 53 on both sides of the first region 51 may be substantially the same, thereby forming a symmetrical shape. The widths of the second and third regions 42, 42', 42", 52, 43, 43', 43" and 53 may extend in a scanning direction of the laser irradiation device.

In one embodiment, the total horizontal length of the light transmitting parts B and E is set to correspond to the length of an organic layer to be formed, in consideration of a process margin. Also, the second regions 42, 42', 42", 52 of the light transmitting parts B and E are configured to have lengths corresponding to those of edge parts of the organic layer. The third regions 43, 43', 43" and 53 are configured to have lengths corresponding to those of edges of the organic layer.

Figure 3E:
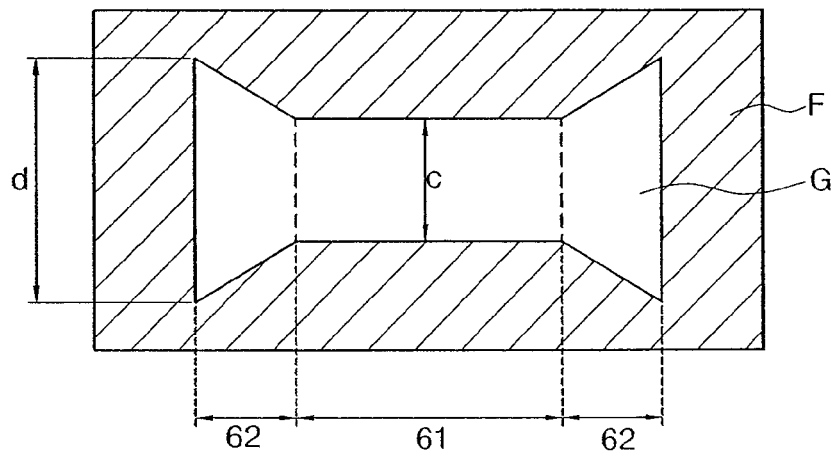
Figure 3F:
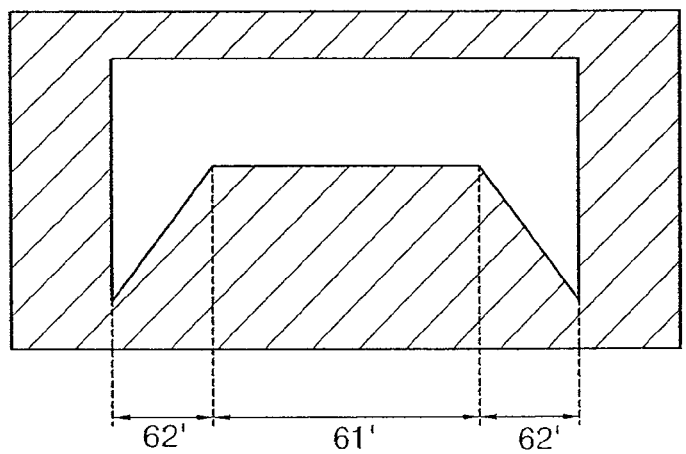
Figure 3G:
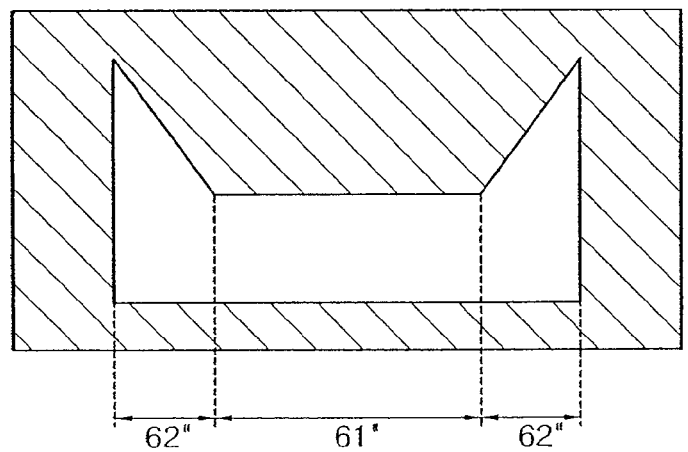

Referring to FIG. 3E, a mask may include a light blocking part F for blocking a laser beam and a light transmitting part G transmitting the laser beam. The light transmitting part G includes a first region 61 and second regions 62 positioned on both sides of the first region 61. The second regions 62 have a shape of a trapezoid. Each of the second regions 62 have an upper base abutting the first region 61 and a lower base positioned on the opposite side from the first region 61. In the illustrated embodiment, the width of the upper base of the second region 62 may be substantially equal to the width d of the first region 61. The width d of the lower base thereof may be about 1.1 to about 1.5 times the width c of the first region 61. The second regions 62 on both sides of the first region 61 may have substantially symmetrical shapes. Alternatively, as illustrated in FIGS. 3F and 3G, the second regions 62' and 62" may have asymmetric shape in the vertical direction. Here, the widths of the second regions 62, 62' and 62" extend in a scanning direction of the laser irradiation device.

In one embodiment, the total length of the light transmitting part G is set to correspond to the length of an organic layer to be formed, in consideration of magnification of a projection lens and a process margin. Also, lengths of the second regions 62, 62' and 62" of the light transmitting part G are set to correspond to a length from an edge part to an edge of the organic layer.

The mask may have a predetermined pattern. In certain embodiments, the mask may have repeating patterns including at least one of the patterns as described above. Thus, a laser beam which passes through the mask is shaped accordingly. Such a mask may include a light transmitting part. The light transmitting part is configured to have at least two regions having different widths so as to control the dose of the laser beam irradiated on the edge parts and edges of the organic layer.

Figure 4A:
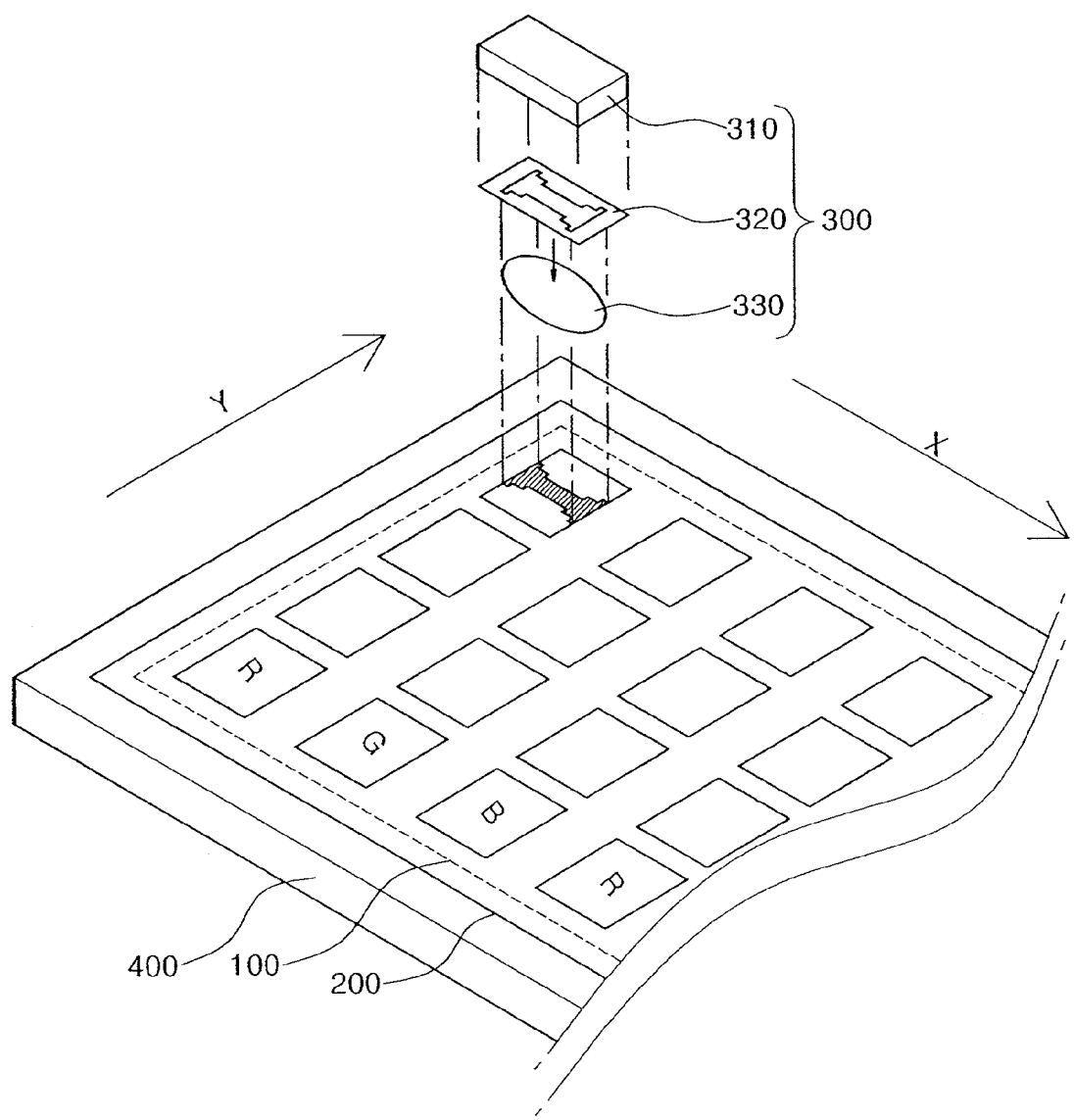
FIG. 4A is a schematic perspective view illustrating a method of fabricating an organic light emitting display device using a laser irradiation device according to one embodiment.
Figure 4B:
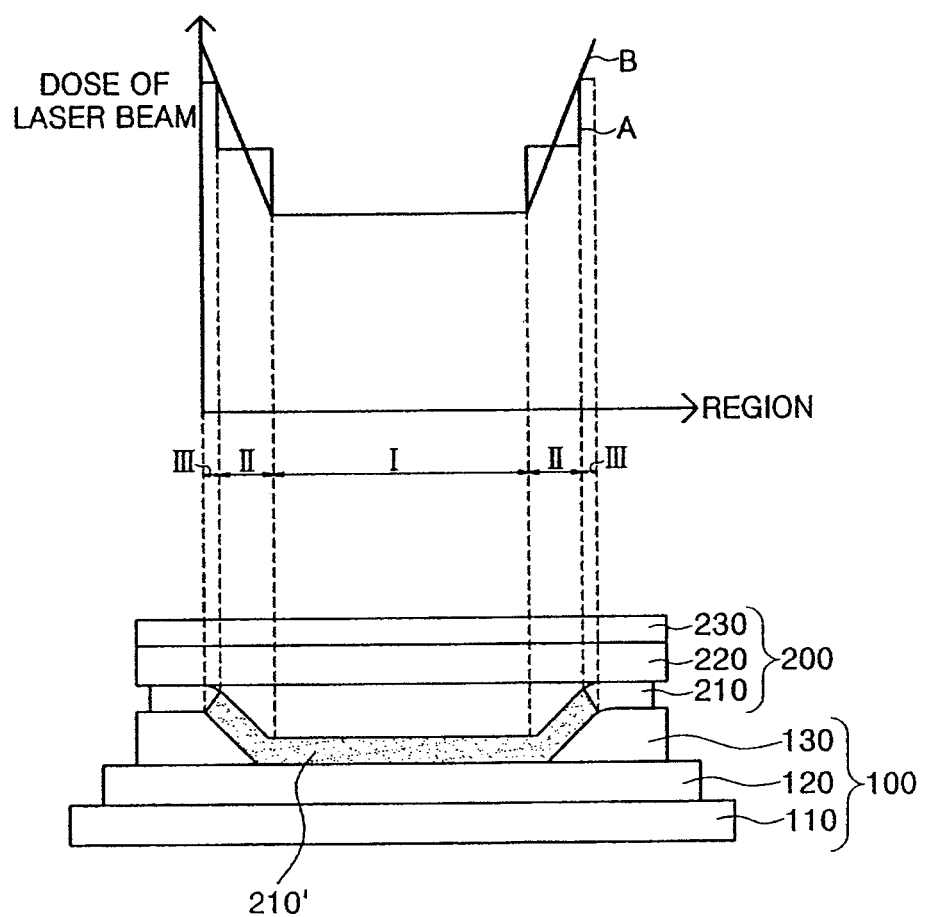
FIG. 4B is a schematic cross-sectional view illustrating a method of fabricating an organic light emitting display device using a laser irradiation device according to one embodiment.

FIGS. 4A and 4B are perspective and cross-sectional views, respectively, illustrating a method of fabricating an organic light emitting display device using a laser irradiation device according to one embodiment. Referring to FIGS. 4A and 4B, a partially fabricated organic light emitting display device (OLED) 100 is placed in a LITI apparatus. The OLED 100 may include a substrate 110 and at least one transistor (not illustrated) formed over the substrate 110. A first electrode 120 may be formed over the substrate 110. A pixel defining layer 130 having an opening exposing a part of the first electrode may be formed on the first electrode 120. The OLED 100 is held by a chuck 400 which can include a moving means.

A donor substrate 200 is placed over the OLED 100. The donor substrate 200 includes a base layer 230, a light-to-heat conversion layer 220, and a transfer layer 210. The transfer layer 210 may be formed of a material for an organic layer.

A laser irradiation device 300 is positioned over the donor substrate 200. The laser irradiation device 300 may include a laser source 310, a mask 320, and a projection lens 330. A laser beam generated from the laser source 310 passes through the light transmitting part or openings of the mask 320.

The mask 320 includes a light blocking part for blocking a laser beam and a light transmitting part transmitting the laser beam. Here, the light transmitting parts may have at least two regions of different sizes, for example, as illustrated in FIGS. 3A to 3G.

The laser beam shaped by the mask 320 passes through the projection lens 330. The projection lens 330 determines magnification of the laser beam. In the illustrated embodiment, the projection lens 330 has unit magnification.

The laser beam passing through the projection lens 330 reaches the donor substrate 200. In the donor substrate 200 irradiated with the laser beam, the light-to-heat conversion layer 220 absorbs the laser beam to generate heat. The transfer layer 210 is transferred onto the OLED 100 due to a change in the adhesion between the light-to-heat conversion layer 220 and the transfer layer 210. As a result, a patterned transfer layer 210' is formed on the substrate 100.

Referring to FIG. 4B, when the laser beam passes through a mask having first to third regions, as illustrated in FIGS. 3A to 3D, the laser irradiation device generates a laser beam having a profile A in which dose increases stepwise from the middle to both ends.

Alternatively, when the laser beam passes through a mask having first and second regions, as illustrated in FIGS. 3E to 3G, the laser irradiation device generates a laser beam having a profile B in which dose increases at both ends.

In the illustrated embodiment, regions I, II and III are regions of the partially fabricated OLED irradiated with the laser beam penetrating the mask illustrated in FIGS. 3A to 3G. Region I may correspond to a pixel electrode exposed by an opening of the pixel defining layer. Region II may correspond to sides of an opening of a pixel defining layer and an edge part of the pixel electrode. Region III may correspond to an edge of an opening. Consequently, when scanning the laser beam having the above profile in the Y direction (FIG. 4A), region I is irradiated with a less dose per unit area than regions II and III.

As a result, a sufficient dose of laser beam may be applied onto the donor substrate laminated on region II to make the donor substrate adhere closely to the edge part of the pixel electrode, thereby forming a transfer layer pattern without a gap. Also, a sufficient dose of laser beam may be applied onto the donor substrate laminated on region III to allow the transfer layer to be easily separated from the donor substrate, thereby forming a clearly cut transfer layer pattern.

When the laser irradiation device 300 reaches an edge of the OLED 100, the chuck 400 may move the OLED 100 in the x direction (FIG. 4A), using a moving means. Then, the LITI process described above may be repeated to form a transfer layer pattern over the OLED.

As mentioned above, the instant disclosure provides a laser irradiation device having a mask including light transmitting parts in which at least two regions are different in size so as to radiate different doses of laser beams to each region when an organic layer is formed by a LITI method. The device minimizes heat damage and maximizes emission efficiency of the organic layer. Also, by the laser irradiation device according to the embodiments, a sufficient dose of laser beam is applied to a donor substrate corresponding to an edge part of an organic layer so as to form a transfer layer pattern without a gap at an edge part of the organic layer, and thus an edge open defect of an organic layer may be prevented. In addition, by the laser irradiation device according to the embodiments, a sufficient dose of laser beam may be applied to a donor substrate corresponding to an edge of an organic layer to form an organic layer which has a clearly cut pattern.

As such, the configurations of the embodiments can maximize emission efficiency by preventing thermal damage of an organic layer when an organic layer is formed by a LITI method and enhance the quality of a transfer layer pattern and transfer efficiency.

Although the instant disclosure has been described with reference to certain embodiments thereof, it will be understood by those skilled in the art that a variety of modifications may be made to the embodiments without departing from the spirit and scope of the disclosure as defined by the appended claims.

What is claimed is:

1. A method of making a display device, comprising:
providing a partially fabricated display device;
providing a laser irradiation device, comprising a mask and a laser source configured to generate a laser beam;
placing a donor device between the partially fabricated display device and the laser irradiation device, the donor device comprising a transferable layer, wherein the transferable layer faces the partially fabricated display device; and
irradiating a laser beam through the mask onto a surface of the donor device, the surface facing the laser beam, while moving the laser beam relative to the donor device along a first axis,
wherein the mask comprises a light transmitting portion, wherein the light transmitting portion has a first length measured in the first axis and a second length measured in a second axis substantially perpendicular to the first axis, wherein the first length varies along the second axis, wherein the first length is greater at both ends of the light transmitting portion along the second axis than the center between both ends, wherein the mask is configured to move relative to the projection plane along the first axis; and
wherein the first length changes by at least about 5% stepwise at least four times along the second axis and wherein the second length of the center is larger than the second length of any portion with a first length larger than the first length of the center.

2. The method of claim 1, wherein the display device comprises a partially fabricated organic light emitting display device.

3. The method of claim 1, wherein the laser beam reaches part of the donor device surface and moves along the first axis, and wherein a portion of the transferable layer opposing the part of the donor device surface is released from the donor device.

4. The method of claim 1, wherein the laser beam contacts part of the donor device surface and moves along the first axis, wherein a portion of the transferable layer opposing the part of the donor device surface receives energy from the laser beam, and wherein the amount of energy varies in the portion along the second axis.

5. The method of claim 4, wherein the amount of energy is greater near two opposing edges of the portion that are generally parallel to the first axis than in the middle of the portion between the two opposing edges.

6. The method of claim 5, wherein the display device has a surface facing the transferable layer, wherein the display device comprises a recess on the surface, the recess having two opposing edges that are generally parallel to the first axis, and wherein the two opposing edges of the portion of the transferable layer substantially face the two opposing edges of the recess.

7. The method of claim 6, wherein the middle of the portion of the transferable layer has a shape generally corresponding to the shape of the recess when viewed from over the surface of the display device.

8. The method of claim 4, wherein two opposing edges of the portion that are generally parallel to the first axis receive the energy for a longer period of time than the middle of the portion between the two opposing edges.

9. The method of claim 4, wherein the energy comprises thermal energy.

* * * * *